United States Patent
Dittus et al.

(10) Patent No.: US 7,529,101 B2
(45) Date of Patent: *May 5, 2009

(54) ASSEMBLY RETENTION LATCH HAVING CONCAVE RELEASE STRUCTURE

(75) Inventors: Karl Klaus Dittus, Durham, NC (US); James Goode, Morrisville, NC (US); Aubrey Lamond Hodges, Oxford, NC (US); Timothy Andreas Meserth, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/104,721

(22) Filed: Apr. 17, 2008

(65) Prior Publication Data

US 2008/0192448 A1 Aug. 14, 2008

Related U.S. Application Data

(63) Continuation of application No. 11/221,650, filed on Sep. 7, 2005, now Pat. No. 7,385,829.

(51) Int. Cl.
*H05K 5/00* (2006.01)

(52) U.S. Cl. ............... 361/756; 361/600; 361/726; 361/747; 361/807; 361/810; 174/250; 174/255; 174/261; 174/268

(58) Field of Classification Search ............... 361/756, 361/600, 807, 810, 726, 747; 174/250, 255, 174/261, 268
See application file for complete search history.

(56) References Cited

U.S. PATENT DOCUMENTS

| 4,405,972 | A | * | 9/1983 | Fiorentino et al. | 361/807 |
|---|---|---|---|---|---|
| 4,435,029 | A | | 3/1984 | McKenzie | 312/320 |
| 5,319,524 | A | | 6/1994 | Welch et al. | 361/754 |
| 5,398,156 | A | | 3/1995 | Steffes et al. | 361/683 |
| 5,423,691 | A | | 6/1995 | Pickles | 439/327 |
| 5,926,378 | A | | 7/1999 | DeWitt et al. | 361/788 |
| 5,943,218 | A | | 8/1999 | Liu | 361/801 |
| 5,967,633 | A | | 10/1999 | Jung | 312/223.2 |
| RE36,695 | E | | 5/2000 | Holt | 312/265.6 |
| 6,056,579 | A | | 5/2000 | Richards, III et al. | 439/358 |
| 6,185,106 | B1 | | 2/2001 | Mueller | 361/798 |
| 6,208,527 | B1 | | 3/2001 | McMahon et al. | 361/801 |
| 6,256,191 | B1 | | 7/2001 | Curlee | 261/683 |
| 6,297,957 | B1 | | 10/2001 | Johnson et al. | 361/687 |
| 6,542,356 | B2 | | 4/2003 | Gan | 361/683 |
| 6,545,877 | B1 | | 4/2003 | Agha et al. | 361/801 |
| 6,674,650 | B1 | | 1/2004 | Davis et al. | 361/796 |
| 6,687,134 | B2 | * | 2/2004 | Vinson et al. | 361/798 |

(Continued)

*Primary Examiner*—Dean A. Reichard
*Assistant Examiner*—Xiaoliang Chen
(74) *Attorney, Agent, or Firm*—Harrington & Smith, PC

(57) ABSTRACT

In one non-limiting aspect thereof this invention provides a structure having a generally planar quadrilateral shape that includes a bottom portion defining a mounting section; a vertical wall portion that extends upwards from the bottom portion and a top-most portion having a generally triangular shape in cross-section and forming along widest portion thereof a lip having a lower surface. The lower surface has a generally rectangular shape characterized by a concave cutout along a middle portion of an outer edge for reducing an amount of force that is required to be applied to the top-most portion to bend the top-most portion about a central axis thereof.

20 Claims, 5 Drawing Sheets

U.S. PATENT DOCUMENTS

| | | | |
|---|---|---|---|
| 6,731,515 B2 | 5/2004 | Rhoads | 361/796 |
| 6,772,246 B2 | 8/2004 | Kim et al. | 710/62 |
| 6,865,085 B1 | 3/2005 | Ferris et al. | 361/721 |
| 7,002,811 B2 * | 2/2006 | Jing et al. | 361/801 |
| 7,029,365 B2 | 4/2006 | Chang et al. | 451/5 |
| 7,142,414 B2 | 11/2006 | Lee et al. | 361/679 |
| 7,283,376 B2 * | 10/2007 | Han et al. | 361/801 |
| 7,385,829 B2 * | 6/2008 | Dittus et al. | 361/801 |
| 2004/0085728 A1 | 5/2004 | Barth et al. | 361/690 |
| 2006/0114663 A1 * | 6/2006 | Kim et al. | 361/807 |

\* cited by examiner

ASSEMBLY RETENTION LATCH HAVING CONCAVE RELEASE STRUCTURE

CROSS REFERENCE TO RELATED APPLICATION

This is a continuation patent application of U.S. patent application Ser. No. 11/221,650 filed on Sep. 7, 2005 now U.S. Pat. No. 7,385,829.

TECHNICAL FIELD

These teachings relate generally to mechanical structures and to retaining mechanisms for maintaining a first structure in mechanical engagement with a second structure.

BACKGROUND

Industry trends toward miniaturization of computer systems have resulted in a requirement to fit more components into reduced enclosure volumes. One area that has been significantly space constrained relates to Peripheral Component Interconnect (PCI) slots. This is especially a concern for 1 U and 2U (a U is defined herein to be a rack height unit equal to 1.75 inches) rack optimized servers, where full height PCI slots must be oriented horizontally (i.e., parallel to the system board) in order to fit within the enclosure. To support such horizontally-disposed PCI slots, the PCI connectors may be placed on a riser board that plugs vertically into a PCI connector on the system board, thereby effectively cantilevering the PCI printed circuit boards or cards from the horizontally-disposed PCI connectors. To then support the cantilevered PCI cards, that extend horizontally from the riser board, a support structure is typically required to prevent the PCI cards from being damaged during installation and removal, and also when the system is shipped pre-configured. This support structure, or "cage", solution (that encompasses multiple PCI adapters, the riser board and the support structure) is sufficiently heavy so that the cage typically need be mechanically retained in order to keep the riser board properly connected to the system board. PCI style connectors are fairly long (approximately 123 mm), and this length can make it difficult to ensure that both ends of the riser board are inserted sufficiently to maintain proper communication between the riser and system boards. As can be appreciated, it is imperative that the riser board be securely retained at both ends to prevent the formation of an open or intermittent contact or contacts to the system board PCI connector.

U.S. Published Patent App. No. 20040085728 A1 discloses an enclosure containing a card cage in which contact between electronic cards and card cage is accomplished by providing compression retainers. In one embodiment, electronic cards are removed by releasing a repeater retainer.

U.S. Pat. No. 6,865,085 B1 discloses an enclosure that includes a cylindrical body and one or more modular card cages adapted to receive one or more electronic circuit cards. The one or more modular card cages include an outer frame member in direct physical and thermal contact with an inner wall of the cylindrical body, an inner frame member, one or more support members coupled between the outer frame member and the inner frame member, and a plurality of electronic device retainers adapted to couple to the modular card cage and to hold each of the one or more electronic circuit cards in direct physical and thermal contact with one of the one or more support members. A device retainer keeps a positive pressure on an electronic card and provides consistent contact between the electronic card and modular card cage. An electronic card is removed by releasing the device retainer.

U.S. Pat. No. RE36695 E discloses a captive latch mechanism for use with an expansion card cage in a personal computer. The retainer further includes an intermediate section extending between the first end and the second end. The intermediate section includes a locking notch immediately adjacent the second end that is configured to releasably engage a wall adjacent the retainer aperture to thereby releasably lock the card guide retaining device in an engaged position.

U.S. Pat. No. 5,319,524 A discloses a card cage with parallel slots for circuit boards carrying retainer clips having edge fasteners for detachably connecting the clip to the circuit board, and at least one cage fastener for releasably connecting the clip to the card cage to hold the circuit board in place. Finger grips lift pivotable clasps to release retainer clips from the card cage.

U.S. Pat. No. 4,435,029 A discloses a straight locking handle that is provided for mounting a circuit card module to a card cage or rack. The module is released from the cage by pulling the handle to flex and bow the latter to a release position for disengaging the cage to allow removal of the module. Upon re-insertion, the handle is pushed flat against the front edge of the module by the operator such that the operator need not push against the circuit card module edge. After insertion, the handle is translated downwardly to a locking position engaging the cage to prevent removal of the module.

SUMMARY OF THE PREFERRED EMBODIMENTS

The foregoing and other problems are overcome, and other advantages are realized, in accordance with the presently preferred embodiments of these teachings.

In one non-limiting aspect thereof this invention provides a structure having a generally planar quadrilateral shape that comprises a bottom portion defining a mounting section; a vertical wall portion that extends upwards from the bottom portion and a top-most portion having a generally triangular shape in cross-section and forming along a widest portion thereof a lip having a lower surface. The lower surface has a generally rectangular shape characterized by a concave cut-out along a middle portion of an outer edge for reducing an amount of force that is required to be applied to the top-most portion to bend the top-most portion about a central axis thereof.

In another non-limiting aspect thereof this invention provides an assembly that comprises a chassis; a system board mounted above the chassis that includes a first connector; a cage structure containing at least one circuit board connected to a riser board, where the riser board comprises a second connector mated to the first connector. The cage structure further comprises walls defining an open channel adjacent to a surface thereof generally parallel to the riser board. The assembly further includes a latch mechanism disposed within the open channel and coupled to the chassis along a bottom portion of the latch mechanism that defines a mounting section. The latch mechanism further includes a vertical wall portion that extends upwards from the bottom portion and a top-most portion having a generally triangular shape in cross-section that forms along a widest portion thereof a lip having a lower surface. The lower surface is in contact with and applies a bearing force along an edge of one of the walls that defines the open channel. The lower surface has a generally rectangular shape characterized by a concave cut-out along a middle portion of an outer edge for reducing an amount of force that is required to be applied to the top-most portion to bend the top-most portion about a central axis thereof for releasing the lower surface from the edge of the wall, for enabling the cage structure to be removed from the assembly.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

The exemplary embodiments of this invention provide a simple, flexible mechanism that securely retains both ends of the riser board connector and cage, while being easy to remove for installation, service, and upgrade tasks.

While discussed in the context of electronic system chassis, PCI cards, PCI enclosure cages and connectors, it should be apparent that the use of the embodiments discussed below are not limited to only these particular applications.

The exemplary embodiments of this invention provide in one aspect thereof a structure and mechanism that orient and securely retain a riser board/cage structure to ensure both proper installation and sufficient wipe contact between the system board connector and the riser board.

Figure 1A:
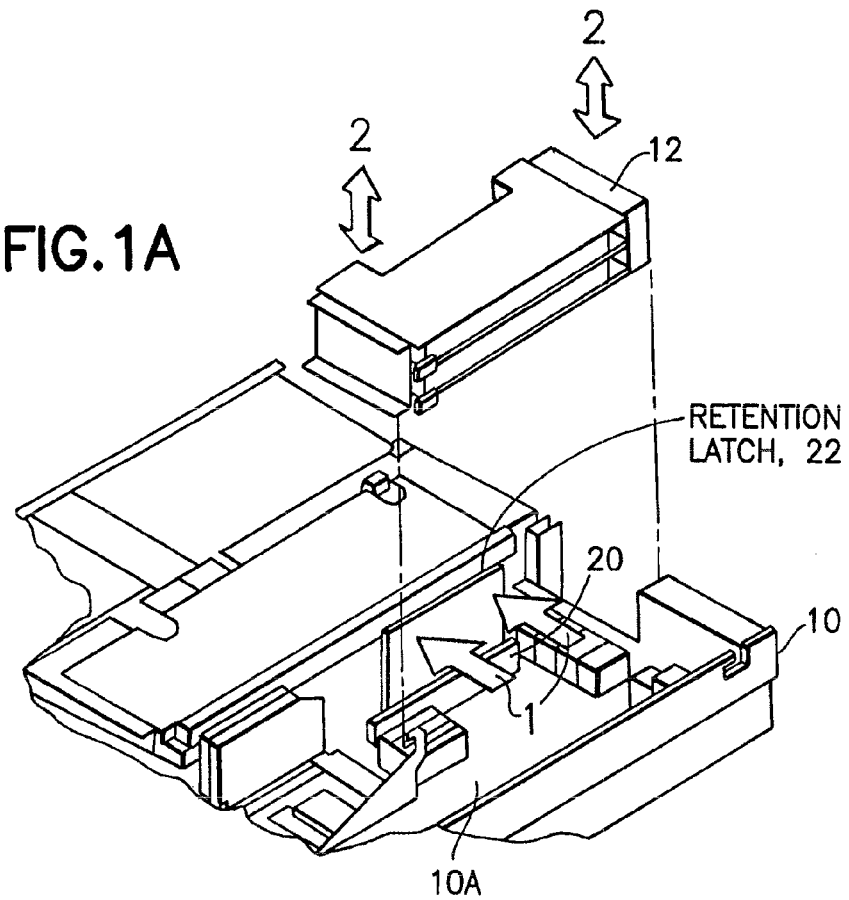
FIG. 1A is an isometric view of a PCI riser cage oriented above a retention latch mechanism.
Figure 1B:
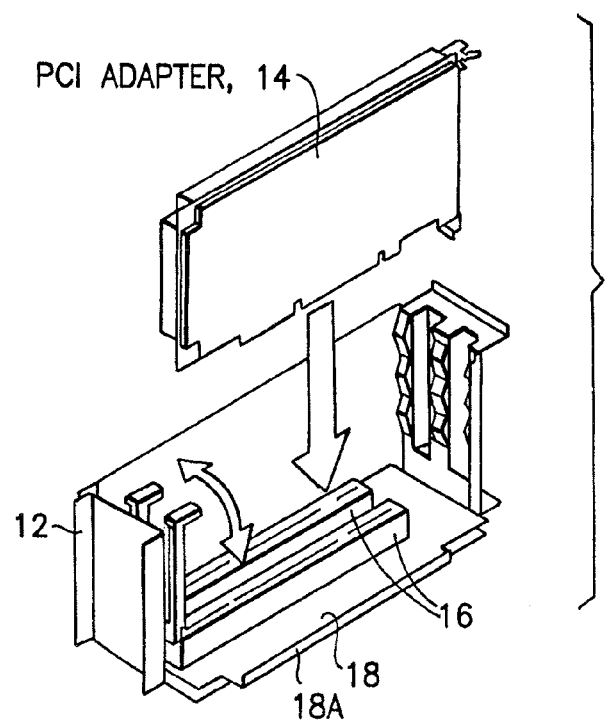
FIG. 1B shows a PCI adapter installed into a riser board that forms a part of the PCI riser cage.

FIG. 1A shows an isometric view of an electronic system enclosure, such as a server or a computer chassis 10, that includes a system board 10A and a PCI riser cage 12 having, for example, two PCI cards or adapters 14 installed within. Referring also to FIG. 1B, the PCI adapter 14 has an edge connector 14A that is inserted into a PCI edge connector socket 16 mounted on a riser board 18. The riser board 18 includes along one edge thereof an edge connector 18A that fits into a riser board edge connector socket 20 that is mounted to the system board 10A. A riser board contoured retention latch mechanism 22, described in further detail below, is shown in FIG. 1A installed so as to be oriented vertically to the system board 10A rearward of the riser board edge connector socket 20. The PCI riser cage 12 is shown in FIG. 1B rotated 90 degrees from the normal orientation when installed within chassis 10. The Arrows designated 1 indicate the direction and general locations of force applied to the contoured retention latch mechanism 22 so as to release the cage 12, and the Arrows 2 indicate the general direction of movement of the PCI riser cage 12 during installation and removal from the chassis 10.

Reference is made to FIGS. 7A, 7B, 8A, 8B, 8C and 8D for showing in greater detail an exemplary embodiment of the contoured retention latch mechanism 22. The contoured retention latch mechanism 22 may have a generally planar quadrilateral shape, such as a rectangular shape. At a bottom portion thereof is a mounting section, such as one characterized by mounting feet 22A, 22B having openings for receiving mounting screws for attaching the contoured retention latch mechanism 22 to the system board 10A and/or to the underlying chassis 10. In other embodiments the mounting section could be formed differently, such as by providing protruding bosses that snap into prepared holes in the chassis. A vertical wall structure 22C extends upwards from the feet 22A, 22B and may include stiffening ribs 22D or similar structures to provide mechanical strength and rigidity. A top-most portion 22E of the contoured retention latch mechanism 22 has a generally triangular shape in cross-section and forms along lower-most widest portion thereof a lip portion 22F having lower surface 22F'. The lower surface 22F' is the portion that engages the riser cage 12 when the riser cage 12 is inserted into the chassis 10. Various features (e.g., reliefs 23) may be provided if desired.

Figure 2:
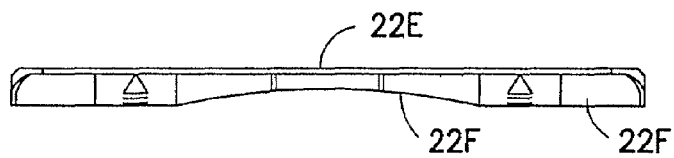
FIG. 2 shows an embodiment of a contoured retention latch mechanism view from directly above.
Figure 6A:
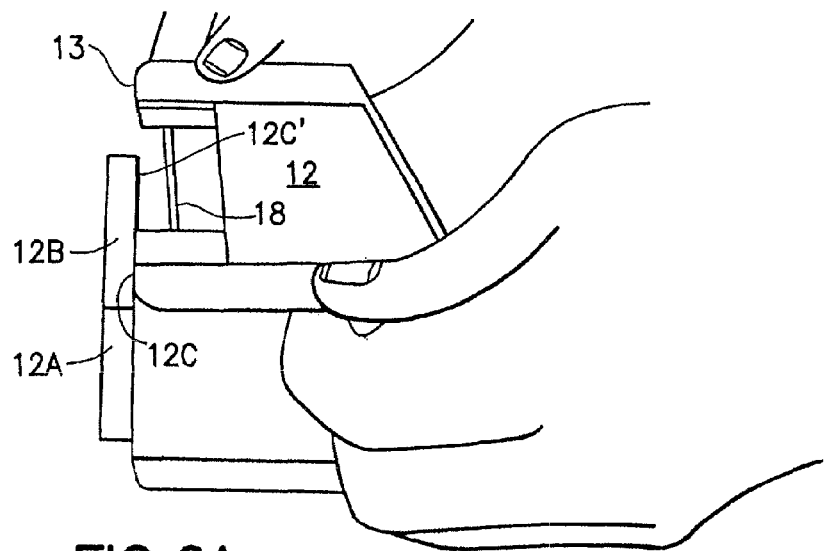
FIGS. 6A and 6B are simplified elevational views of the riser case illustrating an open channel structure adjacent to a rear surface thereof for containing the contoured retention latch mechanism.
Figure 6B:
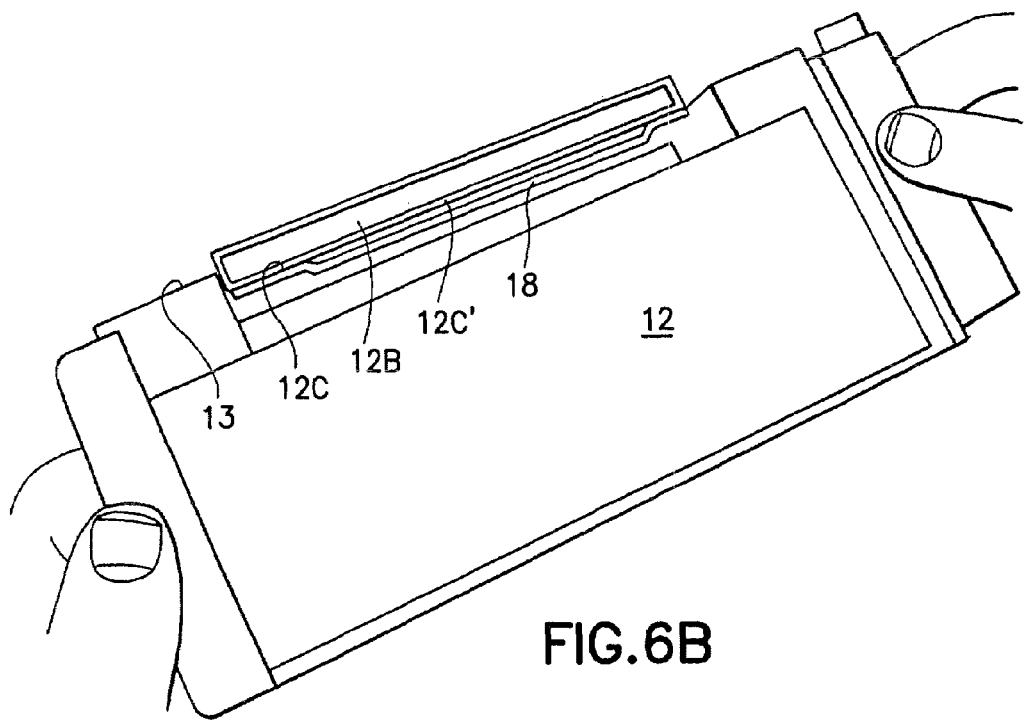
Figure 7A:
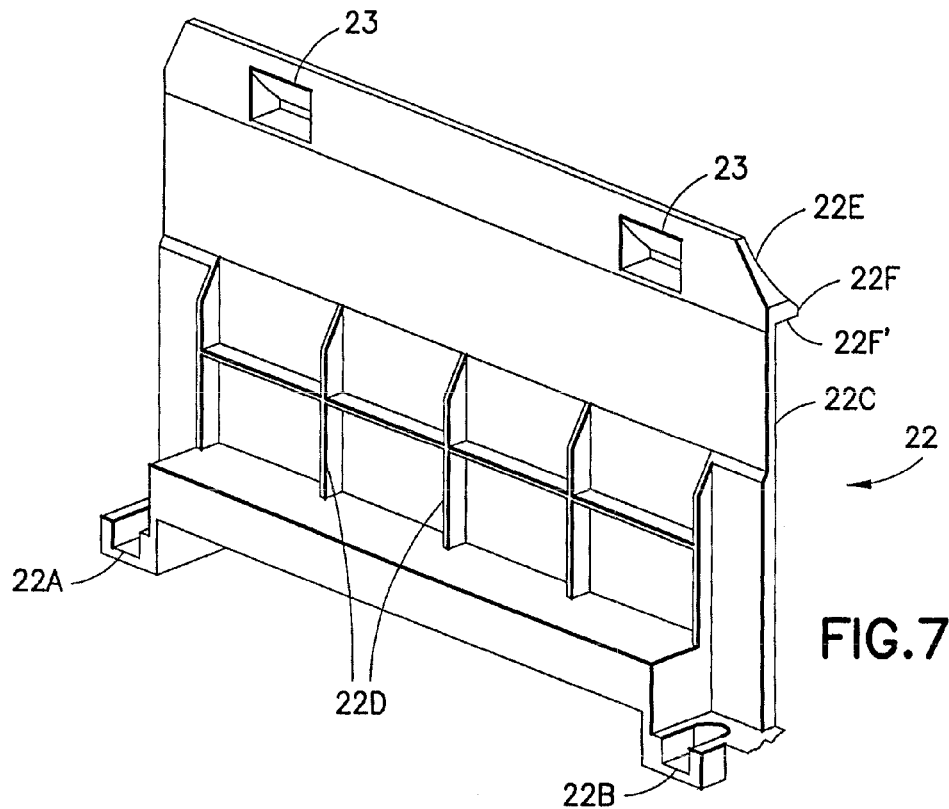
FIGS. 7A and 7B are elevational back and front views, respectively, of the contoured retention latch mechanism.
Figure 7B:
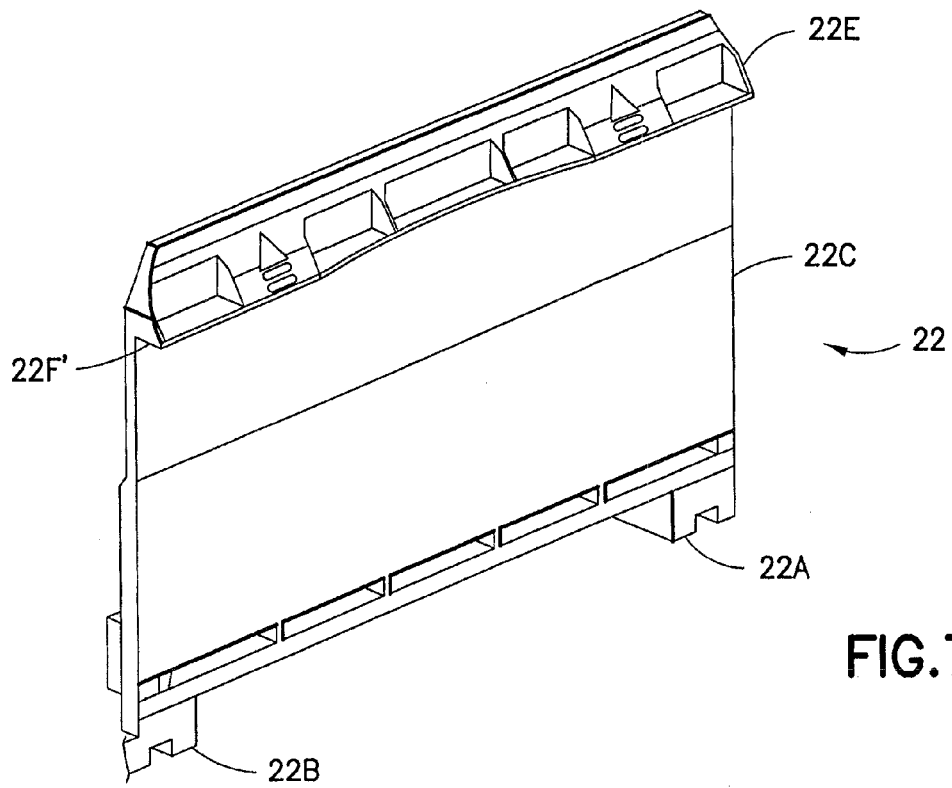

Referring to FIGS. 6A and 6B, along a back surface 13 of the riser cage 12 there is formed a box-like structure 12A defining an open channel 12B. The box-like structure 12A may be fabricated from, for example, sheet metal. A surface of the box-like structure 12A that is nearest to the back surface 13 of the cage 12, referenced as 12C, has a top-most edge surface 12C'. During use, the open channel 12B is positioned over the top-most portion 22E of the contoured retention latch mechanism 22, and is slid down over the contoured retention latch mechanism 22. Due to inherent flexibility in the contoured retention latch mechanism 22 the lower surface 22F' of the top-most portion 22E moves forward, after the lower surface 22F' is clear of the open channel 12B, and rides over and engages the top-most edge surface 12C'. This engaged relationship is shown more clearly in FIG. 3, when considered with FIG. 2. At this time the rear wall of the riser cage 12, and the riser board 18, are securely retained by the downward bearing force exerted by the lower surface 22F' on the top-most edge surface 12C', which tends to urge the cage 12 towards the chassis 10.

Figure 3:
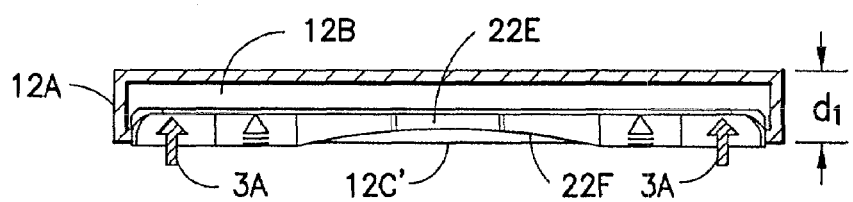
FIG. 3 illustrates the contoured retention latch mechanism of FIG. 2 in a locked position, and also shows the locations where a releasing force is applied.
Figure 4:
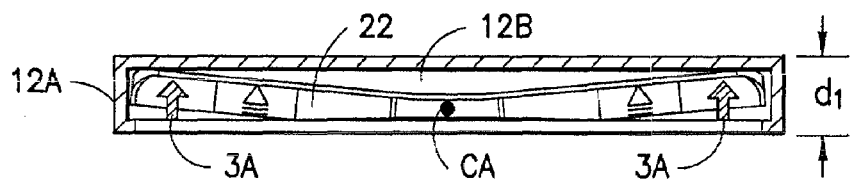
FIG. 4 shows the contoured retention latch mechanism of FIGS. 2 and 3 bent into a release position.

In order to release the riser cage 12 a user exerts force in the direction of the Arrows 3A in FIG. 3 (see also the Arrows 1 in FIG. 1A), thereby deforming the top-most portion 22E so that the lower surface 22F' slides off of and becomes disengaged from the top-most edge surface 12C' of the case 12, as shown in FIG. 4, thereby enabling the cage 12 to be lifted up and over the contoured retention latch mechanism 22, and out of the chassis 10 as indicated by the Arrows 2 in FIG. 1A.

Figure 5A:
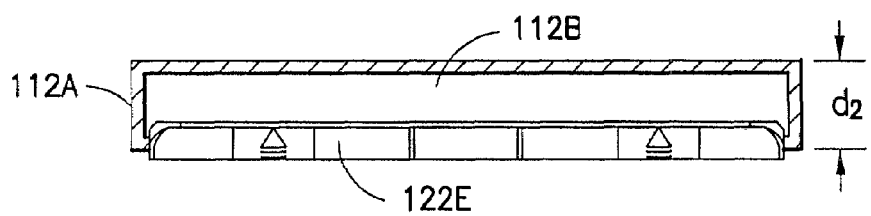
FIGS. 5A and 5B show for comparison purposes an uncontoured retention latch mechanism in the locked position and in the release position, respectively.
Figure 5B:
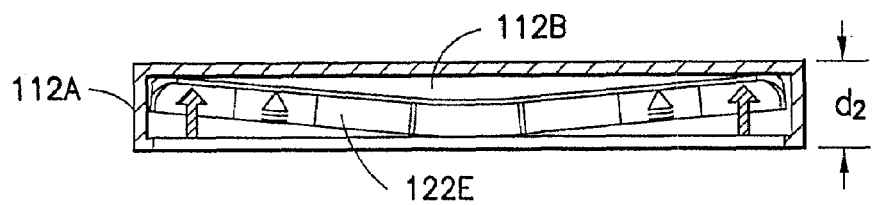
Figure 8A:
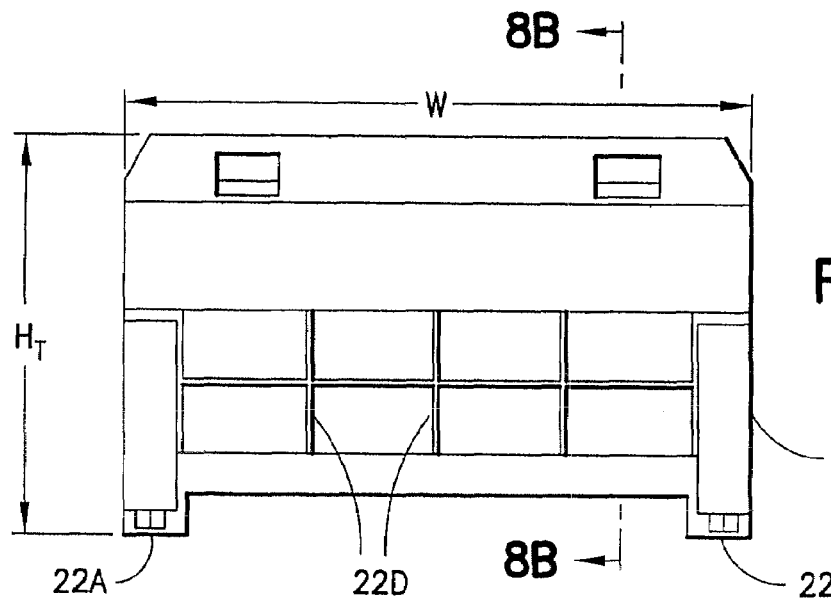
FIG. 8A is a back view of the contoured retention latch mechanism.
Figure 8B:
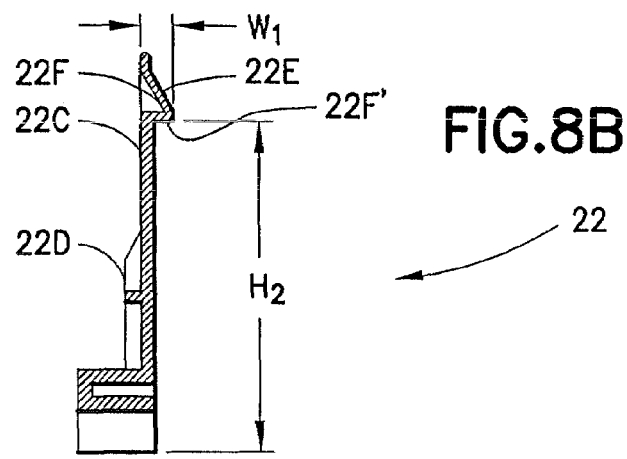
FIG. 8B is a cross-section of the contoured retention latch mechanism taken along the section line 8B of FIG. 8A.
Figure 8C:
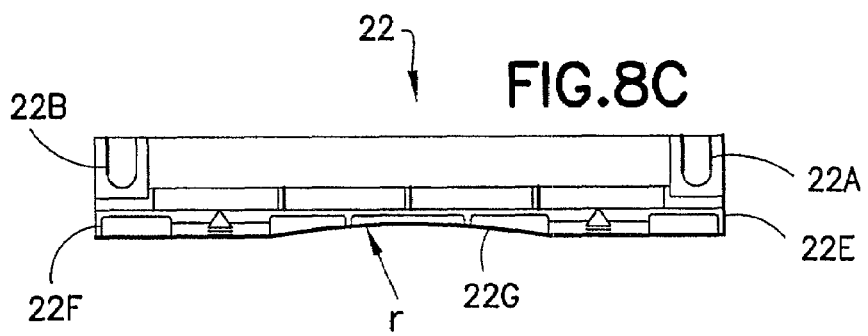
FIG. 8C is a top view of the contoured retention latch mechanism showing a contoured section that engages a surface of the open channel structure shown in FIGS. 6A and 6B.

In accordance with an aspect of this invention the top-most portion 22E has a contoured section, also referred to as a concave region, 22G (see also FIG. 8C). The presence of this contoured section 22G serves to reduce the distance (d1 in FIGS. 3 and 4) that the ends of the top-most section 12E must be deflected to release the cage 12. For comparison purposes, FIGS. 5A and 5B show a top-most portion 122E of an uncontoured retention latch mechanism in the locked position and in the release position, respectively. In this case the required end deflection distance is given by d2, where d2 is >d1. In practice, d2 may be about 15% larger than d1. This implies that a box-like structure 112A would require a larger open channel 112B to accommodate the uncontoured retention latch mechanism, resulting in an undesirable increased overall volume for the cage structure. Exemplary dimensions (mm) of the contoured retention latch mechanism 22 may be (referring to FIGS. 8A and 8B):

W=112
$W_1$=5.8
$H_T$=72
$H_2$=60 with a thickness of about 1-1.5 mm. One suitable, but non-limiting, material to form the contoured retention latch mechanism 22 is PCABS (Acrylonitrile-butadiene-styrene terpolymer/Poly (Bisphenl-A carbonate) containing triphenyl phosphate). PCABS is one material that provides the desired rigidity, while also enabling the contoured release mechanism 22 to be bent and deformed by the user.

Figure 8D:
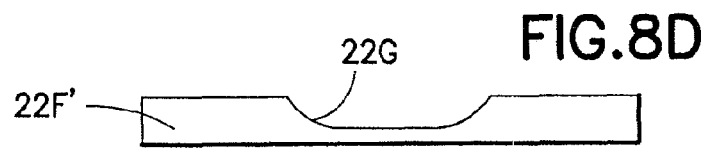
FIG. 8D shows the concave surface area of the contoured section of FIG. 8C.

Assuming the foregoing exemplary dimensions, the concave region 22G may be defined as a segment of a circle having a radius (r) of about 144 mm, as shown in FIG. 8C, resulting in an area of the lower bearing surface 22F' having the shape defined by the concave region (cut-out portion) 22G as shown in FIG. 8D. The view of FIG. 8D is one taken looking along the height ($H_2$) of the retention latch mechanism 22 (FIG. 8B), generally in the direction of the upper dimension arrow. As can be seen in FIG. 8D, the lower surface 22F' has a generally rectangular shape characterized by the concave cut-out portion 22G along an outer edge thereof that acts to reduce an amount of force that is required to be applied to the top-most portion 22E to bend the top-most portion about a central axis (CA, shown in FIG. 4) thereof.

That is, the contoured retention latch mechanism 22 preferably has the concave region 22G removed from the middle portion thereof to ensure that both ends of the riser board 18 of the case 12 are sufficiently retained, by the downward bearing force exerted on the surface 12C', while also significantly reducing (e.g., by about 15%) the total distance that the user must deform the retention mechanism 22 to release the cage 12 during the removal task. The required force that must be applied to achieve the desired amount of deformation of the top-most portion 12E is thus also reduced. Due to the rigidity and vertical orientation of the riser board 18, it has been found that it is unnecessary to provide retention in the middle, if both ends of the riser board 18 are securely retained. As was noted above, an additional benefit of the retention mechanism 22 having the contoured concave middle portion is that it requires a smaller opening in the cage 12, and thus covers less space on the system board 10A.

Various modifications and adaptations may become apparent to those skilled in the relevant arts in view of the foregoing description, when read in conjunction with the accompanying drawings. For example, the concave region 22G need not be defined by a segment of a circle, but may in other embodiments may be defined by a segment of a parabola or some other generally non-circular geometric figure. However, any and all modifications of the teachings of this invention will still fall within the scope of the non-limiting embodiments of this invention.

Furthermore, some of the features of the various non-limiting embodiments of this invention may be used to advantage without the corresponding use of other features. As such, the foregoing description should be considered as merely illustrative of the principles, teachings and exemplary embodiments of this invention, and not in limitation thereof.

What is claimed is:

1. A structure comprising:
   a bottom portion defining a mounting section;
   a vertical wall portion connected to the bottom portion; and
   a top-most portion connected to the vertical wall portion, wherein the top-most portion is opposite the bottom portion, wherein the top-most portion comprises a lip portion, wherein the lip portion comprises a contoured middle section and a bearing surface, and wherein the bearing surface comprises a shape corresponding to the contoured middle portion.

2. The structure of claim 1 wherein the structure comprises a general planar quadrilateral shape.

3. The structure of claim 1 wherein the bearing surface is substantially perpendicular to the vertical wall portion.

4. The structure of claim 1 wherein the mounting section comprises mounting feet configured to be mounted to a system board.

5. The structure of claim 1 wherein the contoured middle section comprises a concave cut-out, and wherein ends of the top-most portion are deflectable about the concave cut-out.

6. The structure of claim 1 wherein an edge of the bearing surface extends along the vertical wall portion.

7. An assembly comprising:
   a cage structure configured to support at least one circuit board;
   a riser board coupled to the cage structure, wherein the riser board comprises at least one connector configured to receive a portion of the at least one circuit board;
   a system board comprising another connector, wherein the riser board is connected to the system board at the another connector; and
   a structure as in claim 1 connected to the system board and engaged with the cage structure.

8. A structure comprising:
   a bottom portion configured to be connected to a system board;
   a vertical wall portion connected to the bottom portion; and
   a top-most portion connected to the vertical wall portion, wherein the top-most portion comprises a first end, a second end, and a contoured section, wherein the first end is proximate a first lateral side of the vertical wall portion, wherein the second end is proximate a second lateral side of the vertical wall portion, wherein the contoured section is proximate a central axis of the structure, wherein the first end and the second end are each configured to be resiliently deflectable about the central axis, and wherein the first end and the second end are configured to engage with a portion of a cage support structure.

9. The structure of claim 8 wherein the contoured section comprises a concave cut-out.

10. The structure of claim 9 wherein the top-most portion further comprises a lip portion having a bearing surface, and wherein the bearing surface comprises a general rectangular shape with the concave cut-out extending therethrough.

11. The structure of claim 9 wherein the lip portion extends from an end of the vertical wall portion.

12. The structure of claim 9 wherein the bearing surface is substantially perpendicular to the vertical wall portion.

13. The structure of claim 8 wherein the contoured section is between the first end and the second end of the top-most portion.

14. An assembly comprising:
   a cage structure configured to support at least one circuit board;
   a riser board coupled to the cage structure, wherein the riser board comprises at least one connector configured to receive a portion of the at least one circuit board;
   a system board comprising another connector, wherein the riser board is connected to the system board at the another connector; and
   a structure as in claim 8 connected to the system board and engaged with the cage structure.

15. An assembly comprising:
   a cage structure comprising an open channel and a top edge surface at an end of the channel, wherein the cage structure is configured to support at least one circuit board;
   a riser board coupled to the cage structure, wherein the riser board comprises at least one connector configured to receive a portion of the at least one circuit board;
   a system board comprising another connector, wherein the riser board is connected to the system board at the another connector, and wherein the system board is substantially perpendicular to the open channel of the cage structure; and
   a retention latch comprising a vertical wall portion, a bottom portion and a top-most portion, wherein the bottom portion extends from a first end of the vertical wall portion, wherein the bottom portion is connected to the system board, wherein the top-most portion extends from a second end of the vertical wall portion, wherein the top-most portion comprises a lip portion having a lower surface, wherein the retention latch extends through the open channel of the cage structure, and wherein the lower surface engages with the top edge surface of the cage structure.

16. The assembly of claim 15 wherein the cage structure further comprises a back surface, and wherein the back surface is between the open channel and the at least one connector of the riser board.

17. The assembly of claim 15 wherein the retention latch is configured to be substantially perpendicular to the at least one circuit board and the system board.

18. The assembly of claim 15 wherein the lower surface exerts a downward bearing force on the top edge surface of the cage structure.

19. The assembly of claim 15 wherein the retention latch is resiliently deflectable within the open channel.

20. The assembly of claim 15 further comprising a computer chassis, wherein the system board is mounted to the computer chassis.

* * * * *